United States Patent
Cheung

[11] Patent Number: 6,134,936
[45] Date of Patent: Oct. 24, 2000

[54] MOLD FOR HEAT SINK

[75] Inventor: Wai-Kwan Cheung, Tuen Mun, China

[73] Assignee: Hoi Po Metal Manufactory Co., LTD, Tuen Mun, The Hong Kong Special Administrative Region of the People's Republic of China

[21] Appl. No.: 09/245,550

[22] Filed: Feb. 5, 1999

[30] Foreign Application Priority Data

Sep. 7, 1998 [CN] China ................................. 98118882

[51] Int. Cl.⁷ ................................................. B21C 25/04
[52] U.S. Cl. ................................................. 72/269; 72/467
[58] Field of Search ............................. 72/254, 269, 467

[56] References Cited

U.S. PATENT DOCUMENTS

| | | | |
|---|---|---|---|
| 4,187,711 | 2/1980 | Lavochkin et al. | 72/253.1 |
| 5,774,964 | 7/1998 | Fisher et al. | 72/254 |
| 5,813,269 | 9/1998 | Yano | 72/269 |

FOREIGN PATENT DOCUMENTS

| | | |
|---|---|---|
| 55-120414 | 9/1980 | Japan . |
| 84001488 | 1/1984 | Japan . |
| 62-179111 | 11/1987 | Japan . |
| 63-295013 | 12/1988 | Japan ........................ 72/269 |
| 1-254315 | 11/1989 | Japan ........................ 72/269 |
| 1-273610 | 11/1989 | Japan ........................ 72/269 |
| 2 088 765 | 6/1982 | United Kingdom . |

OTHER PUBLICATIONS

Maruzen, "Metals Handbook, Revised 4th Edition," Apr. 20, 1986, p. 819, Japanese Metals Congress.

*Primary Examiner*—Ed Tolan
*Attorney, Agent, or Firm*—Alix, Yale & Ristas, LLP

[57] ABSTRACT

A production method and its corresponding mold for manufacturing aluminum alloy heat sinks with extra high profile ratios. The mold comprises a feed section and a form section. The form section is made from a high strength mold steel and contains a plurality of fin forms. The form section includes one or more crossbeams supporting the fin forms. The feed section is generally coaxial with the form section. The mold allows the extrusion of aluminum alloy heat sinks with extra high profile ratios which are difficult to produce by other methods.

23 Claims, 8 Drawing Sheets

MOLD FOR HEAT SINK

BACKGROUND OF THE INVENTION

The present invention relates to metal extrusion, and particularly to a production method and its corresponding mold for the extrusion of aluminum alloy heat sinks with extra high profile ratios.

The speed of computer devices has continuously increased with a resulting increase in the heat given off within these devices. While electric fans can be used to cool CPUs and other computer devices, they have the disadvantage of introducing dust into the computer. This dust deposits over the CPUs and the surfaces of heat sinks, influences the radiation of heat and accelerates the aging of integrated circuits and the like. In extreme cases, the dust may lead to a short circuit and destruction of the device. Therefore, an alternative method for the removal of heat is desired. Heat sinks with high profile ratios can be used as an alternative to fans.

Aluminum alloy heat sinks are used to radiate the heat away from computer devices without the use of fans. To increase the heat removal capacity of the heat sink, the radiating surface area is increased. This is done by increasing the radiating fin height and decreasing the spacing between fins. This ratio of fin height to fin spacing is the profile ratio.

Using traditional solid plate type molds, aluminum alloy heat sinks with a profile ratio of less than five can be produced. Using a combined mold, which is a combination of a hollow mold and a solid mold, aluminum alloy heat sinks having profile ratios of up to six to ten may be produced. Currently, heat sinks having a profile ratio of ten approach the limit that can be produced with this method. This limit is based on the increased fin length and close fin spacing of the heat sink, which requires correspondingly long and thin sections in the mold. As the mold sections become longer and thinner, the cross-sectional area of the mold section, and its yield strength, decreases. Starting around a profile ratio of ten, the design strength of steels available for these long, thin mold sections is exceeded, leading to destruction of the mold. Until now, it has been very difficult for the world wide aluminum extrusion industry to overcome the problem of producing molds capable of extruding heat sinks with extra high profile ratios. Therefore, there is a need for a method and mold design which is capable of producing heat sinks with extra high profile ratios.

SUMMARY OF THE INVENTION

An object of the present invention is to provide a production method and its corresponding mold for the extrusion of aluminum alloy heat sinks, especially heat sinks with extra high profile ratios.

The object of the invention is realized in a preferred embodiment by the use of a mold which comprises a feed section, also known as a feed mold, and a separate form section, also known as a form mold. The form section contains a hollow female profile for the extrusion of a corresponding male heat sink shape. The body of the form section contains an internal cavity with a plurality of fin forms cantilevered from one wall of the cavity. Each fin form corresponds to a space between adjacent fins on the extruded heat sink. The spaces between adjacent fin forms and between the fin forms and the cavity wall create the female profile shape complementary to the heat sink to be produced. The form section also includes at least one crossbeam supporting the cantilevered fin forms. The feed section has a bore which is coaxial with the form section.

Preferably the aluminum alloy being extruded contacts the crossbeams before the fin forms. Also the crossbeams, fin forms and form section body are preferably integral.

During the extrusion process, semi-solid aluminum alloy is extruded from an ingot holder to the feed section. The feed section directs the semi-solid aluminum alloy past the crossbeams. The crossbeams divide and slow the aluminum alloy flow and decrease the pressure exerted by the aluminum alloy on the fin forms. The alloy flows into the profile shape, solidifying to the desired heat sink shape. The solidified heat sink shape is forced through the remainder of the form mold by the pressure of the semi-solid aluminum alloy behind it.

BRIEF DESCRIPTION OF THE DRAWINGS

Other objects and advantages of the invention will become apparent from the drawings, in which.

DESCRIPTION OF THE PREFERRED EMBODIMENTS

Figure 1:
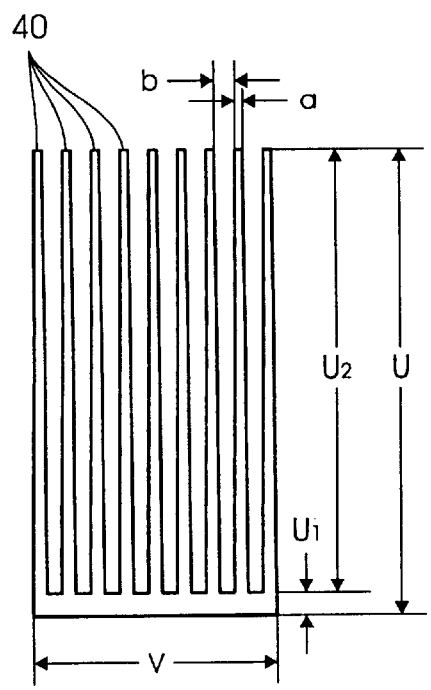
FIG. 1 is a diagrammatic side elevation view of an aluminum alloy heat sink with an extra high profile ratio.

FIG. 1 shows a diagrammatic elevational view of the shape of an aluminum alloy heat sink having an extra high profile ratio, including the cross-sectional shape of the radiating fins 40. Referring to FIG. 1, $U_1$ represents the height of the heat sink base and $U_2$ represents the fin height. U, the overall heat sink height, is equal to $U_1+U_2$. V represents the width of the heat sink. The direction transverse to the width V is the extrusion direction. The thickness of the heat sink along the extrusion direction is not shown, and can be varied. The width of a radiating fin is designated by a and the spacing between adjacent fins is designated by b. The fin width and spacing can be constant, or may be variable, as when the fin tapers from a wider base to a narrower tip. The fin forms of a mold correspond to b, the space between two adjacent fins of the heat sink. As the fin spacing b of the heat sink is decreased, the cross-sectional area of the corresponding fin form decreases and the profile ratio increases. As the cross-sectional area of the fin form decreases, the force required to deform the fin form also decreases. Therefore, the higher the profile ratio of the heat sink, the more difficult it is to produce.

Figure 2:
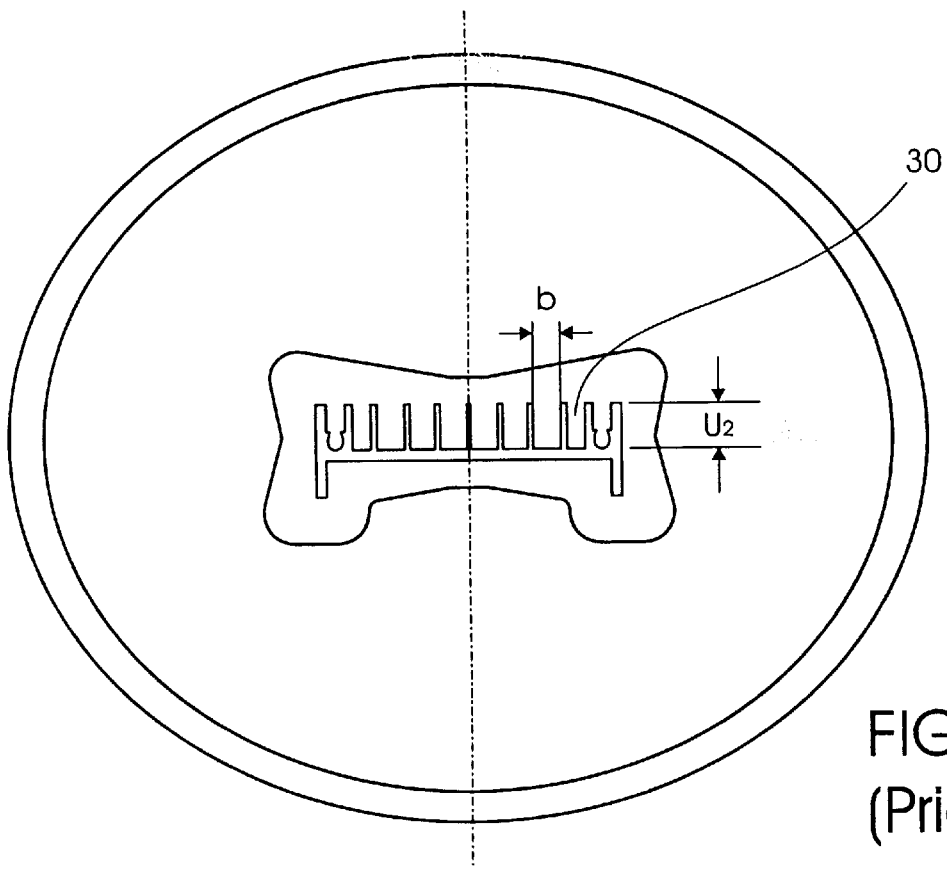
FIG. 2 is a diagrammatic top view of a mold for the production of aluminum alloy heat sinks having low profile ratios.

FIG. 2 is a diagrammatic view of a solid plate type mold for the production of heat sinks with low profile ratios on the order of five, as seen from the extrusion direction. As can be seen, the height $U_2$ of the fin that can be produced is small and the spacing between adjacent fins b is large. The ratio between the fin height $U_2$ and the fin spacing b is less than five so that the mold fin form 30 has sufficient strength to withstand the extrusion pressure. For aluminum alloy heat sinks with profile ratios of more than five, the mold design shown in FIG. 2 cannot be used.

Figure 3:
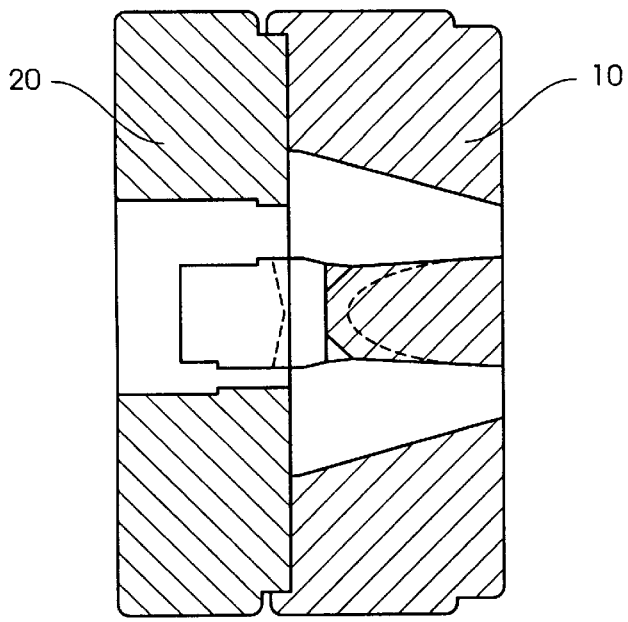
FIG. 3 is a schematic sectional view of a combination mold comprising a solid plate mold and a hollow mold for producing aluminum alloy heat sinks with higher profile ratios.

FIG. 3 is a schematic cross-section of a combination mold for manufacturing heat sinks with higher profile ratios. This type of mold comprises a feed mold 10 and a form mold 20, which together form the heat sink profile. This type of combination mold is suitable for manufacturing aluminum alloy heat sinks with higher profile ratios of between five and ten. However, it still does not have sufficient strength for the extrusion of aluminum alloy heat sinks with profile ratios greater than about ten.

Figure 4:
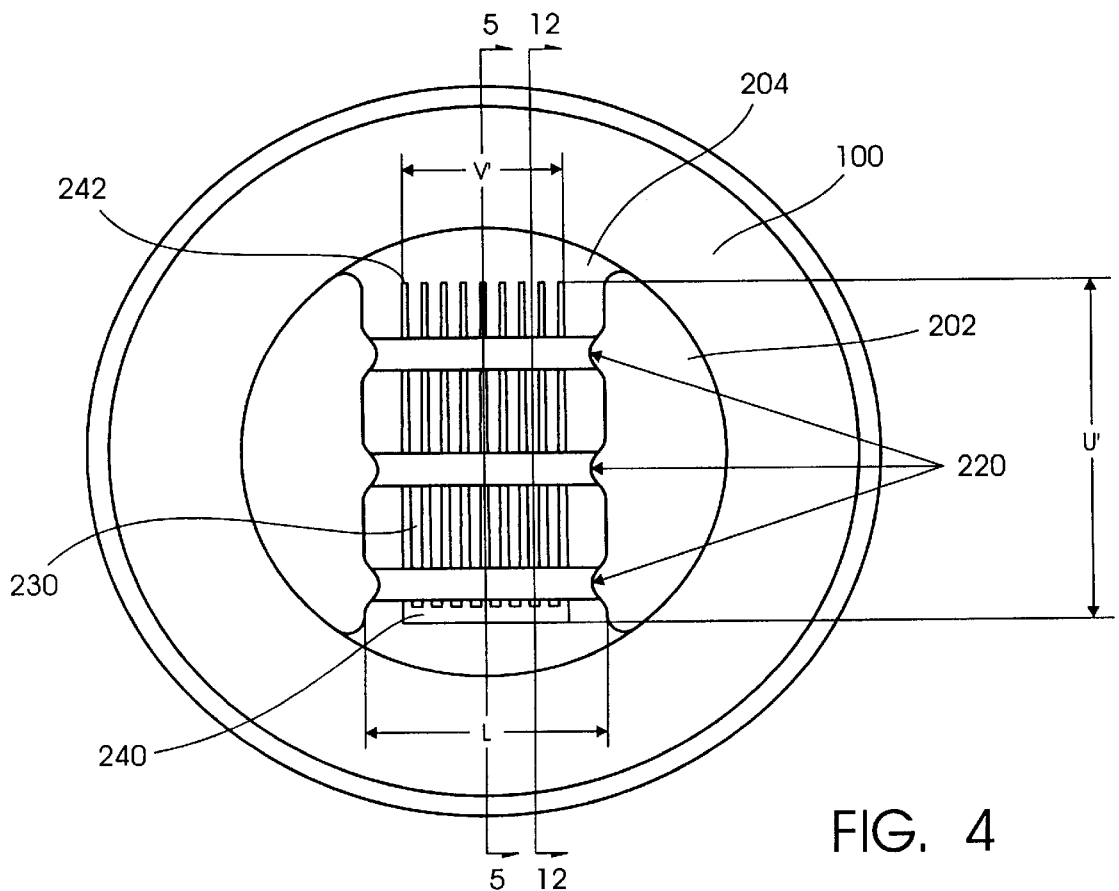
FIG. 4 is a diagrammatic top view of a mold of the present invention showing the bridge-like crossbeams.
Figure 9:
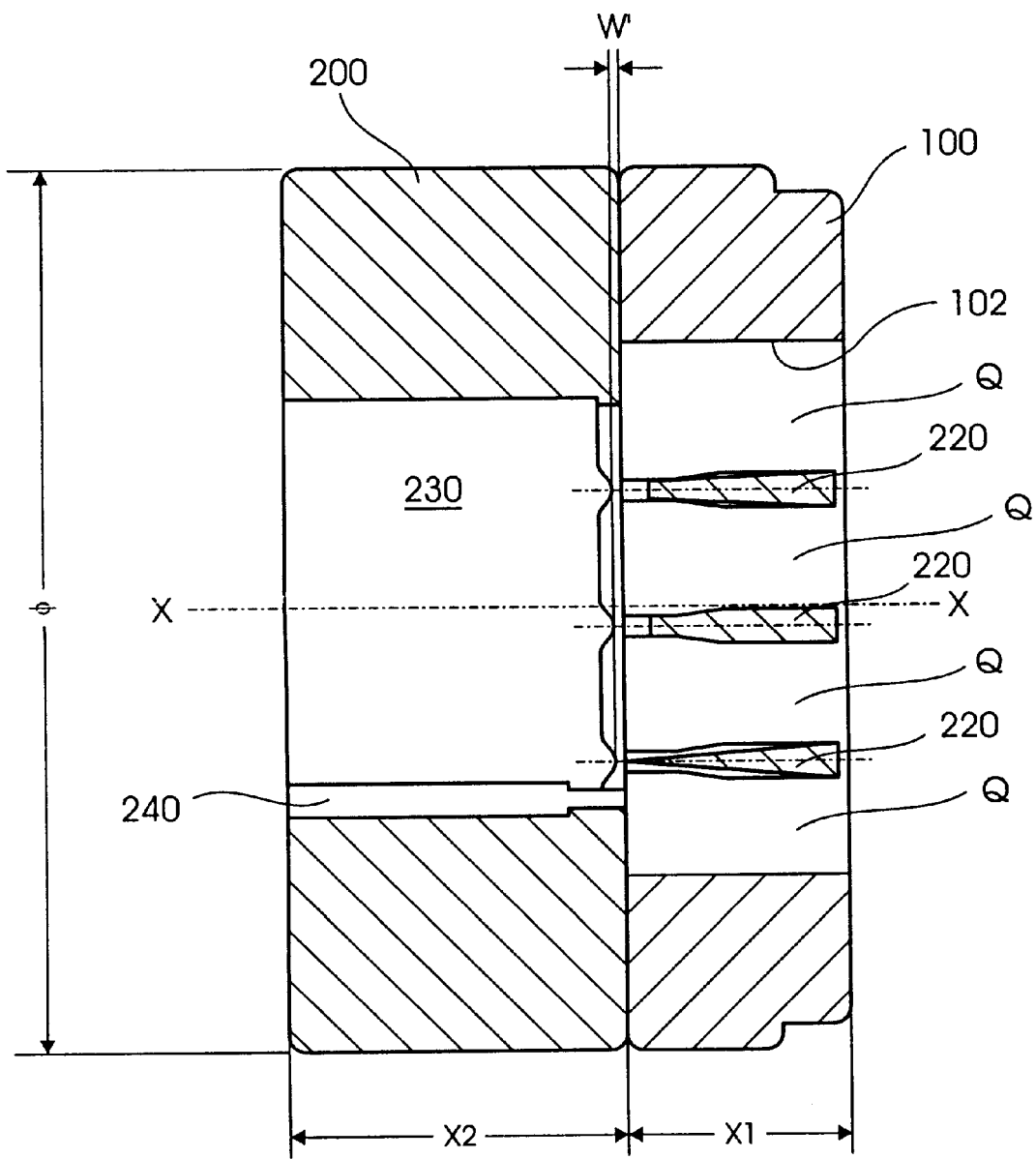
FIG. 9 is a sectional and partly diagrammatic view of a mold for the production of the aluminum alloy heat sink of FIG. 6.
Figure 10:
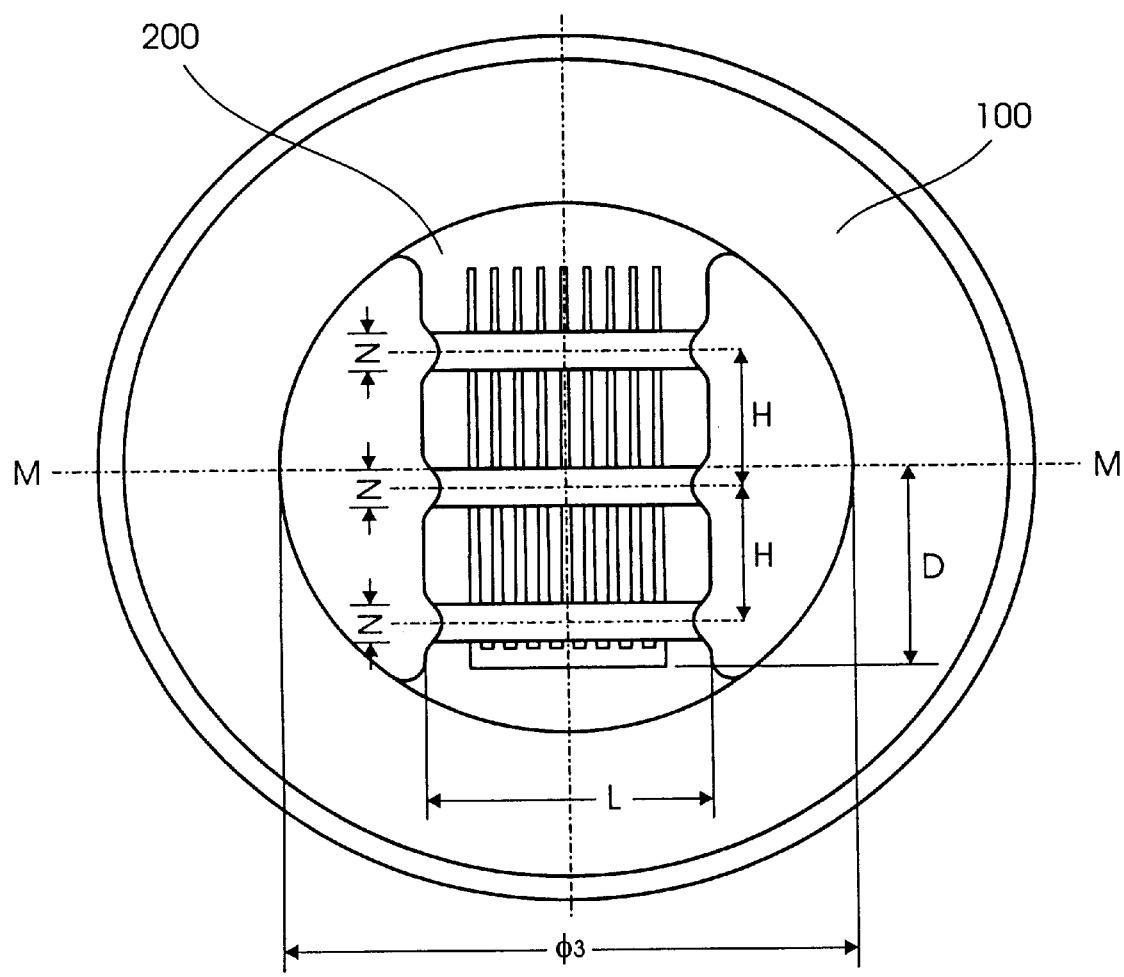
FIG. 10 is a diagrammatic top view of a mold embodying the present invention for the production of the heat sink of FIG. 6.
Figure 11:
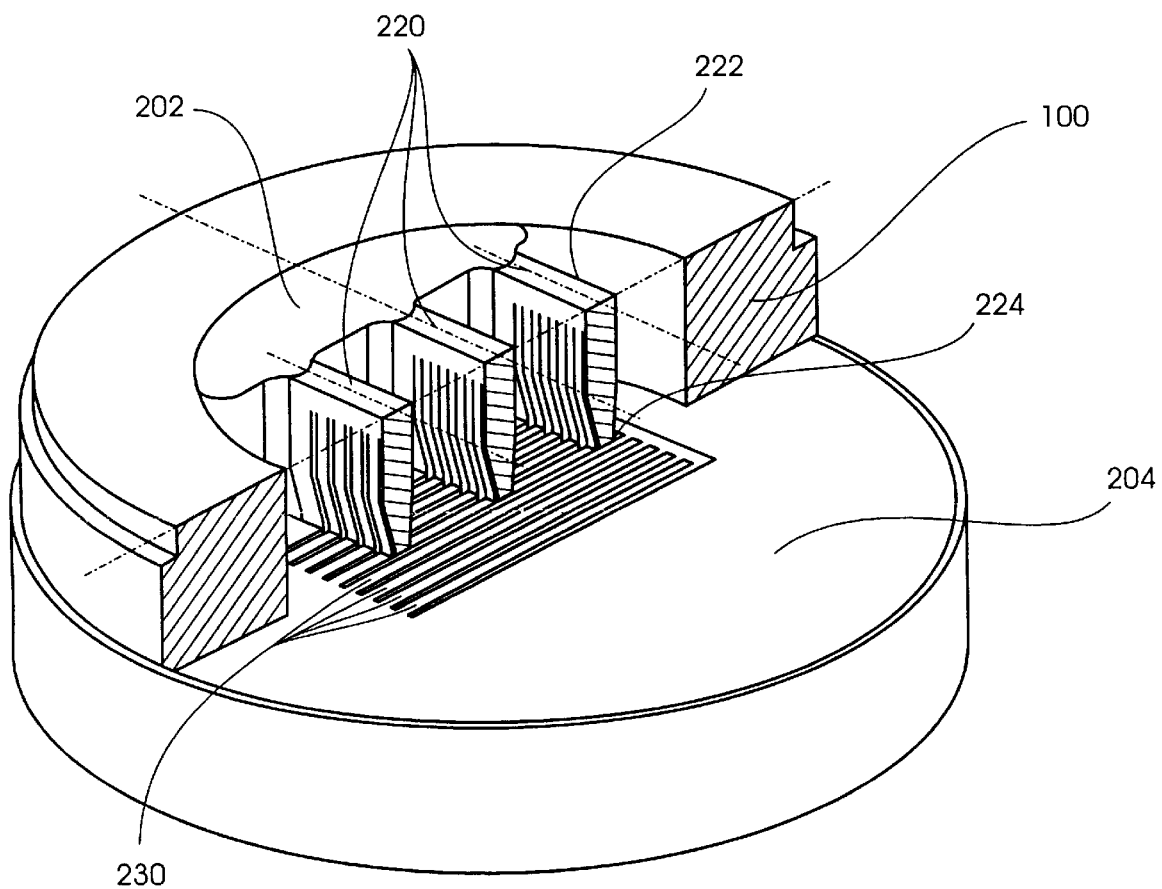
FIG. 11 is a partially cut away perspective view of a partial mold of the present invention.

FIG. 4 is a diagrammatic top view of an inventive mold capable of the extrusion of heat sinks having profile ratios greater than ten. As can be seen from this Figure, the mold comprises a feed section, generally designated 100, and a form section, generally designated 200. The form section has an input end 202 and a body 204. The body 204 has an internal cavity 240 defined by a wall 242. Within the cavity, eight fin forms 230 are attached to the wall 242 and cantilevered toward an opposing side. The spaces between the wall 242 and the fin forms 230 and between adjacent fin forms create the branched profile shape which is complementary to the shape of the desired heat sink and through which the semi-solid aluminum alloy is extruded. Above the fin forms 230, are crossbeams 220, attached at their ends to the form section input end 202. The crossbeams 220 are further attached to the fin forms 230 (also shown in FIG. 11). The feed section 100 also has a cavity. The feed section generally surrounds and is coaxial with the input end 202 of the form section 200 as shown in FIGS. 9, 10 and 11.

In the embodiment shown in FIG. 4 there are three crossbeams 220 perpendicularly spaced along the plurality of fin forms 230. The span L of the crossbeams 220 is greater than the width V' of the fin form plurality. The span L of the crossbeams can be determined either by calculation or from experience. By attaching crossbeams 220 above the fin forms 230, the resistance of the fin forms to bending during the extrusion process is greatly increased. During the extrusion process the crossbeams support the fin forms while allowing the semi-solid aluminum alloy to completely fill the form section profile. The crossbeams allow the use of fin forms with a greater height and closer spacing than is possible with solid plate type or combination molds. For this reason, heat sinks with extra high profile ratios can be produced with a mold of the type embodied in FIG. 4.

Figure 12:
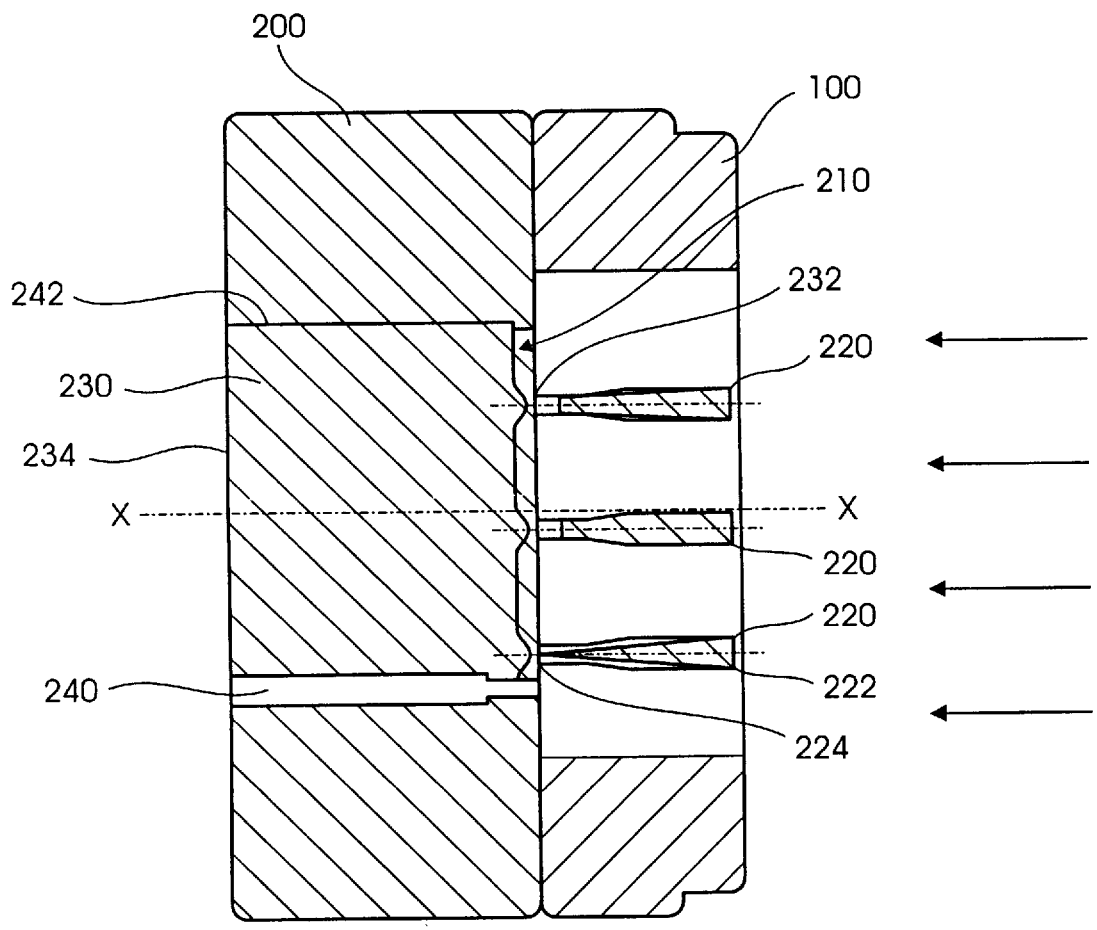
FIG. 12 is a partially in phantom, sectional and partly diagrammatic view of the mold of FIG. 4 along section line 12—12.

FIG. 12 is a partially diagrammatic, cross-sectional view of FIG. 4 along section line 12—12. The section line bisects a fin form 230. The feed section 100 is on the right side and the form section 200 is on the left side of this Figure. The direction of the extrusion flow, is shown by the arrows. This Figure shows the form section cavity wall 242 (illustrated in phantom) with a cantilevered fin form 230 attached. This Figure also shows three crossbeams 220 supporting the fin form 230. The fin form has a leading edge 232 facing into the extrusion flow and an opposing trailing edge 234. The crossbeams 220, similarly have leading and trailing edges, 222 and 224 respectively. Preferably, the leading edge 232 of the fin form is attached to the trailing edge 224 of the crossbeam.

Figure 5:
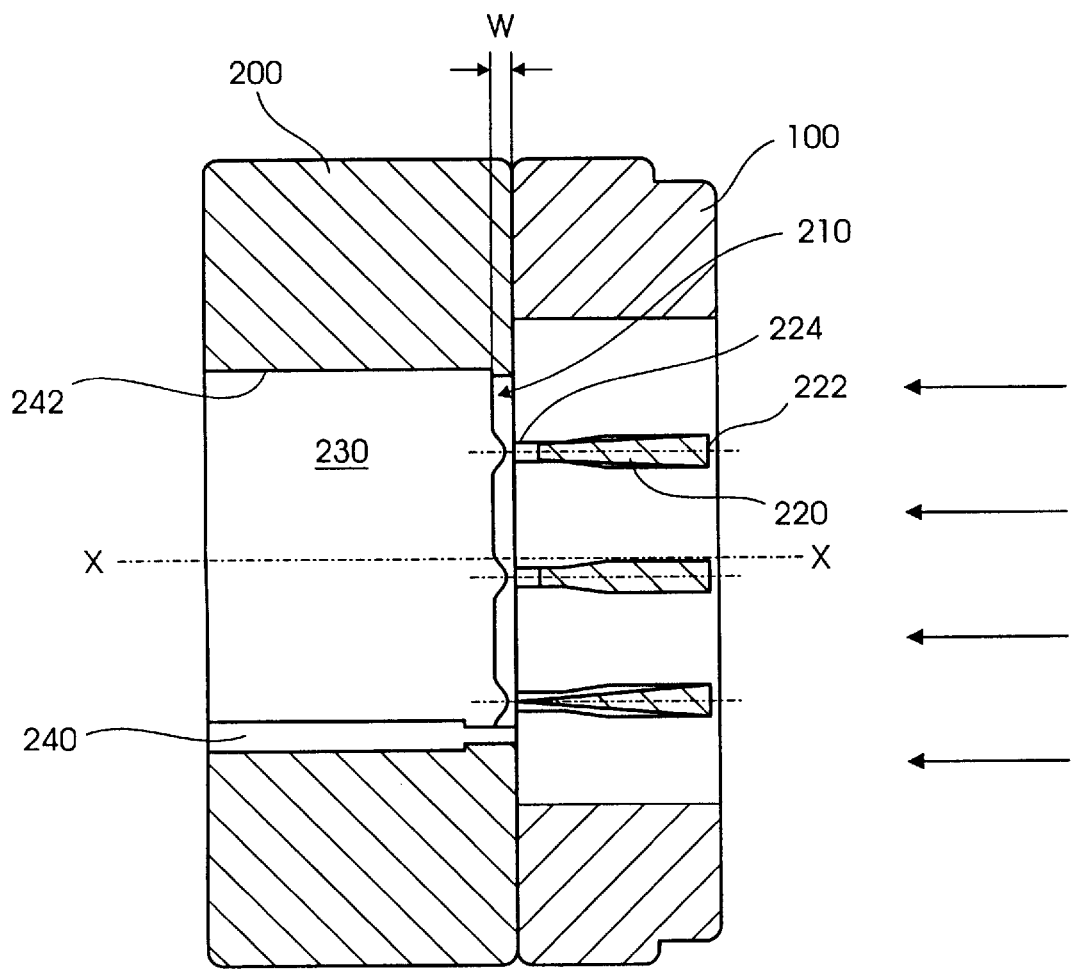
FIG. 5 is a sectional and partly diagrammatic view of the mold in FIG. 4 along section line 5—5.

FIG. 5 is a partially diagrammatic, cross-sectional view of FIG. 4 along section line 5—5. This section line bisects the space between two adjacent fin forms. This Figure also shows a cross-section of the working zone 210 of the form section 200. In the working zone, semi-solid aluminum alloy solidifies to form the heat sink. The area of the working zone 210 is approximated by the area defined by the profile height, U', and profile width V' shown in FIG. 4. The length W of the working zone can be varied, although a length of several millimeters has been found satisfactory. The working zone produces a frictional effect on the extrusion flow. Thus, as the working zone is lengthened, the resistance to flow of the extrusion alloy is increased and the extrusion flow rate of the alloy is decreased.

A fin form 230 is also shown in FIG. 5 with one end attached to the cavity wall 242 and the opposing end cantilevered away from the wall. The fin form 230 is supported by three crossbeams 220.

During the extrusion operation, semi-solid aluminum alloy is forced into the feed section 100. The alloy is guided into the form section input end where it contacts the bridge-like crossbeams 220. The crossbeams divide the incoming alloy, slowing and guiding the alloy into the form section profile shape. The aluminum alloy further slows and solidifies into the shape of the form section profile as it moves through the working zone 210. The solidified shape is forced in the extrusion direction by the pressure of the semi-solid aluminum alloy behind it. The solidified alloy heat sink emerging from the form section discharge end has an extra high profile ratio, requiring only cutting to the desired length and possibly a post extrusion straightening of the fins to become an acceptable product.

The fin forms 230, even with the support of the crossbeams 220, are still subject to high stresses during the extrusion process. For this reason, the form section 200 is preferably manufactured from a material with a high allowance stress $\delta_h$, such as, for example 166 kilograms per square millimeter, at a temperature of 550° C. Mold steel CG-2 has been found satisfactory for the manufacture of form sections, although other mold steels can also be used.

Figure 6:
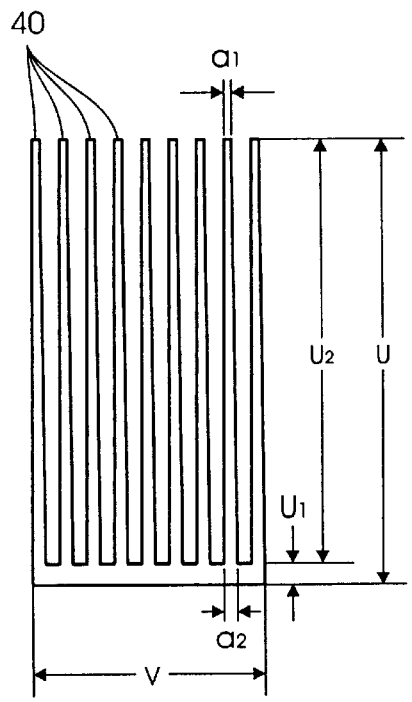
FIG. 6 is a diagrammatic side elevational view of a heat sink having an extra high profile ratio.

FIG. 6 shows a diagrammatic view of an extra high profile ratio heat sink manufactured with a mold embodying the invention. The heat sink includes nine radiating fins 40. The width of the heat sink, V, is 37.22 millimeters; the combined height of the fin and base of the heat sink, U, is 84.00 millimeters; the height of the base, $U_1$, is 4.00 millimeters; the fin height, $U_2$, is 80.00 millimeters; the width of a fin at the projecting tip, $a_1$, is 1.2 millimeters; the width of a fin at the base, $a_2$, is 1.7 millimeters, and the spacing between the center lines of each radiating fin is 4.44 millimeters. The inventive mold allows production of this heat sink with profile surfaces that are level, smooth and which contain no lines, veins or scratches. In addition, tolerances can be held in accordance with GB 5237-93 of China (High Precision Grade) or U.S. Y145M1994.

Figure 7:
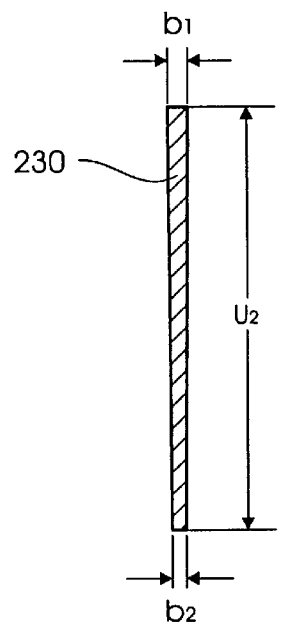
FIG. 7 is a diagrammatic view of the spacing between two adjacent fins in the heat sink of FIG. 6; it also is a schematic view of a fin form for creating the spacing.

FIG. 7 shows the profile and dimensions for a single fin form 230, as would be part of the form section profile used for the production of the heat sink shown in FIG. 6, each fin form corresponding to a space between two adjacent heat sink fins. The width of the fin form at the attached end is designated $b_1$, while the width of the fin form at the cantilevered end is designated $b_2$. For a fin form used in a mold to produce the heat sink shown in FIG. 6; $b_1$=center line spacing–$a_1$, or 4.44–1.20=3.24 millimeters; $b_2$=center line spacing–$a_2$, or 4.44–1.70=2.74 millimeters; and the height of the fin form $U_2$ is 80.00 millimeters. The cross-sectional area of a fin form, F, can be obtained from the equation:

$$F=[(b_1+b_2) \times U_2] \div 2.$$

For the heat sink shown in FIG. 6, the fin form cross-sectional area F is given by:

$$F=[(3.24+2.74) \times 80] \div 2$$

$$F=239.20 \text{ millimeters.}$$

The profile ratio for a fin form can be obtained from the equation:

$$\text{Profile Ratio} = F \div (b_1)^2.$$

For the heat sink shown in FIG. 6, $$\text{Profile Ratio} = 239.20 \div (3.24)^2$$

$$=22.79$$

$$\approx 22.80$$

The profile ratio of approximately 22.80 puts the heat sink shown in FIG. 6 in the extra high profile ratio category. Heat sinks in this category of profile ratios cannot be manufactured with either solid plate or combination molds, requiring the use of a mold of the present invention.

While the inventive mold is unique, the other equipment used for the extrusion of extra high profile ratio heat sinks is conventional. For example, an 800 metric ton extruder with an extrusion cylinder diameter of 118 millimeters and a maximum unit pressure of 73kilograms per square millimeter has been found sufficient for extrusion of extra high profile ratio heat sinks when used with the inventive mold.

Figure 8:
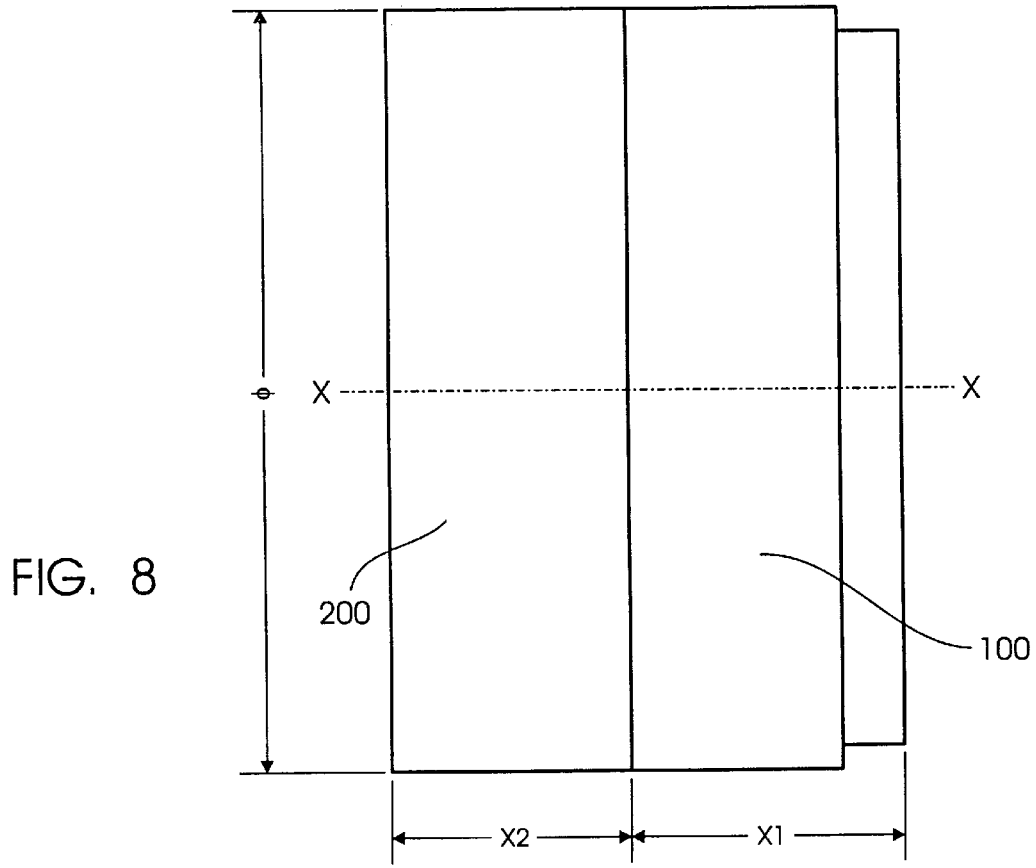
FIG. 8 is a diagrammatic outline view of the shape of a mold for the manufacture of the heat sink of FIG. 6.

FIG. 8 diagrammatically shows the side profile shape and dimensions of a cylindrically shaped extrusion mold embodying the invention. The central line of the mold along the extrusion flow direction is shown by the X axis. X1 is the length of the feed section in the extrusion flow direction and X2 is the length of the form section in the extrusion flow direction. The overall length for both the feed section and the form section is limited to 108.00 millimeters and the outside diameter is limited to 180.00 millimeters by the extrusion press. The required length of the form section X2 to withstand use at a designed extruder unit pressure can be calculated by the formula:

$$X2=U_2(b \times P \div \delta_h)^{1/2},$$

where $b=(b_1+b_2) \div 2;$

P is the unit pressure for the extruder;

$\delta_h$ is the allowance stress for the mold material; and $U_2$ is the height of the fin.

For a heat sink with a high profile ratio as shown in FIG. 6:

$b=(3.24+2.74) \div 2 \approx 3;$ $U_2=80$ millimeters;

P can be taken as 48 kilograms per square millimeter; and $\delta_h$ can be taken as 140 kilograms per square millimeter.

For the heat sink shown in FIG. 6, the form section length in the extrusion direction, $X_2$, required to withstand the design extrusion conditions is:

$$X2=80(3 \times 48 \div 140)^{1/2}$$

$$=80(1.014)$$

$$=81 \text{ millimeters}$$

Since the inventive mold allows the crossbeams 220 to help support the fin forms 230, the form section length in the extrusion direction can be reduced from 81 millimeters without exceeding the design strength of the fin forms. The crossbeams also improve the bearing capacity of the fin forms 230 to lateral pressure. Given a desired lessened length in the extrusion direction X2 of 65 millimeters, the feed section width in the extrusion direction X1 can be calculated, using the previous formula of X1+X2=108 millimeters, as 43millimeters.

FIG. 10 is a diagrammatic top view of a mold used to produce a heat sink having a high profile ratio as shown in FIG. 6. This Figure shows the spacing between the central axis of the crossbeams H and the transverse width of the crossbeams Z. D is the distance from the central axis M—M to the wall 242 of the form section cavity opposing the fin form cantilevered ends. Φ3 is the internal diameter of the feed section 100.

For this mold, the span of each crossbeam, L (shown in FIG. 4) is 56.00 millimeters; and Z, the transverse width of each crossbeam, is 8.00 millimeters. P, the unit pressure of the extrusion press, is 73 kilograms per square millimeter. $\delta_h$, the allowance stress for the mold material, remains, as in the previous examples, 140 kilograms per square millimeter. D is 42.00 millimeters and Φ3 is 110.00 millimeters.

The center axis spacing H for three crossbeams can be calculated from the formula:

$$H=L \times [P \div (2 \times \delta_h)]^{1/2}.$$

Using the above numbers, the center axis spacing for three crossbeams H, is calculated as:

$$H=56 \times [73.00 \div (2 \times 140)]^{1/2}$$

$$H=28.59.$$

FIG. 9 is a cross section of a mold similar to that of FIG. 5. As shown in this Figure, the spaces between adjacent crossbeams 220 and between the feed mold internal wall 102 and the adjacent crossbeams define "branching holes" or "guide channels", Q, for guiding the semi-solid aluminum alloy into the fin forms 230. Because the crossbeams guide the incoming flow of semi-solid aluminum alloy, the length of the working zone in the region below the crossbeams W' is reduced by up to a factor of two from the normal length W.

FIG. 11 is a perspective, partially cutaway view of one embodiment of the present invention. As can be seen, the partial mold comprises a feed section 100 surrounding the form section input end 202. The form section body 204 is a stepped surface below the input end. This Figure further shows the crossbeams 220, which are perpendicular to, and integral with, the cantilevered fin forms 230. The crossbeams 220 support the fin forms during the extrusion process.

FIG. 11 also shows another embodiment of the invention, wherein the crossbeam 220 has a tapered shape. The crossbeams narrow from the leading edge 222 to the trailing edge 224. The tapered shape of the crossbeam 220 not only guides the flow of the semi-solid aluminum alloy into the form section body, but also helps slow the flow of the semi-solid aluminum alloy, reduces the extrusion pressure put on the fin forms 230 and strengthens the fin forms.

It would be possible, with extrusion equipment of larger size to manufacture heat sinks with even higher profile ratios, by using four or more crossbeams. It would also be possible to use fewer crossbeams if the strength of the mold materials is increased. The dimensions of the extrusion molds can also be varied for production of different heat sinks.

While preferred embodiments of the foregoing invention have been set forth for purposes of illustration, the foregoing description should not be deemed a limitation of the invention herein. Accordingly, various modifications, adaptations and alternatives may occur to one skilled in the art without departing from the spirit and scope of the present invention.

What is claimed:

1. A method for producing a heat sink with radiating fins, comprising:

providing a mold of the type including a form section with an input end, an opposing discharge end, and at least one wall defining a first cavity therethrough, a plurality of spaced fin forms, each having a first end attached to one said form section wall and an opposing second end cantilevered from the first end, and a feed section having an input end, an opposing discharge end and an internal wall defining a second cavity generally coaxial with the first cavity;

supporting said fin forms;

forcing a semi-solid aluminum alloy into said feed section input end at a pressure and a flow rate;

guiding the aluminum alloy into said form section;

flowing the aluminum alloy past the supported fin forms;

extruding a solidified heat sink having a Profile ratio greater than ten from said form section discharge end; and cutting said heat sink to a length.

2. The method of claim 1, wherein:
   at least one crossbeam is attached to the form section; and
   the step of supporting further comprises attaching at least one crossbeam to at least one fin form.

3. The method of claim 2, further comprising:
   dividing the aluminum alloy;
   slowing the flow rate of the aluminum alloy; and
   reducing the pressure of the aluminum alloy.

4. The method of claim 1, further including the step of mounting the mold in an extruder.

5. An extrusion mold, comprising:
   a form section with an input end, an opposing discharge end, an extrusion direction and at least one wall defining a cavity therethrough;
   a plurality of fin forms, each having a leading edge, a trailing edge, a first end attached to one form section wall, said plurality having a profile ratio greater than ten;
   at least one crossbeam attached to the form section, each crossbeam having a leading edge and an opposing trailing edge; and
   at least one crossbeam supporting at least one fin form.

6. The mold of claim 5, further comprising a feed section generally coaxial with the form section, said feed section having an input end, an opposing discharge end and an internal wall defining a second cavity.

7. The mold of claim 6, wherein the feed section internal wall surrounds a plurality of spaced crossbeams, said feed section internal wall being separated from adjacent crossbeams by a plurality of spaces, said spaces comprising a plurality of flow guide channels.

8. The mold of claim 5, wherein at least one crossbeam supports the plurality of fin forms.

9. The mold of claim 5, wherein the crossbeam trailing edge supports each fin form.

10. The mold of claim 5, wherein the fin forms and the crossbeams are integral with the form section.

11. The mold of claim 5, wherein at least one crossbeam has a first transverse width at the leading edge and a lesser transverse width at the trailing edge.

12. The mold of claim 5, wherein a crossbeam defines a longitudinal axis perpendicular to the fin forms.

13. The mold of claim 5, wherein the form section has a plurality of spaced crossbeams defining spaces, said spaces comprising a plurality of flow guide channels.

14. The mold of claim 5, wherein the form section includes three crossbeams.

15. The mold of claim 5, wherein said plurality of fin forms defines a width and at least one crossbeam has a span which is greater than the width.

16. The mold of claim 5, wherein the form section further comprises a working zone.

17. The mold of claim 16, wherein the working zone has a first length in the extrusion direction, said working zone having a second length in the extrusion direction in a region of said crossbeam, said second length ranging from one half the first length to equal to the first length.

18. The mold of claim 5, wherein the form section is comprised of a material with an allowance stress greater than 166 kilograms per square millimeter at a temperature of 550° C.

19. A mold for extruding a heat sink with a profile ratio greater than ten, comprising:
   a cylindrical form section, said form section having an input end, an underlying body and a discharge end, said body including an internal wall defining a cavity, said cavity connecting the input end to the discharge end;
   a plurality of spaced fin forms, each having a leading edge, a trailing edge, a first end attached to the form section wall and an opposing end cantilevered from the first end;
   said cavity wall and said plurality of fin forms defining a heat sink profile shape;
   at least one crossbeam attached to the form section input end, each crossbeam having a leading edge and an opposing trailing edge; said crossbeam attaching to the plurality of fin forms; and
   a cylindrical feed section, with an input end connected to a discharge end by an internal bore, said feed section bore surrounding the form section input end.

20. The mold of claim 19, wherein each crossbeam trailing edge attaches to each fin form leading edge.

21. The mold of claim 19, wherein the bore, the form section input end and the crossbeams define a plurality of flow guide channels.

22. The mold of claim 19, wherein said plurality of fin forms defines a width and at least one crossbeam has a span which is greater than the width.

23. The mold of claim 19, wherein the heat sink profile shape further comprises a working zone.

* * * * *